(12) United States Patent
Gaudin et al.

(10) Patent No.: US 8,350,347 B2
(45) Date of Patent: Jan. 8, 2013

(54) WRITABLE MAGNETIC ELEMENT

(75) Inventors: Gilles Gaudin, Le Sappey (FR); Ioan Mihai Miron, Mataro (ES); Pietro Gambardella, Sant Cugat Des Valles (ES); Alain Schuhl, Grenoble (FR)

(73) Assignees: Centre National de la Recherche Scientifique, Paris (FR); Commissariat a l'Energie Atomique et aux Energies Alternatives, Paris (FR); Universite Joseph Fourier, Grenoble Cedex (FR); Institut Catala de Nanotechnologia, Bellaterra (ES); Institucio Catalana de Recerca I Estudis Avancats (ICREA), Barcelona (ES)

( * ) Notice: Subject to any disclaimer, the term of this patent is extended or adjusted under 35 U.S.C. 154(b) by 92 days.

(21) Appl. No.: 12/899,072

(22) Filed: Oct. 6, 2010

(65) Prior Publication Data
US 2012/0018822 A1 Jan. 26, 2012

(30) Foreign Application Priority Data
Jul. 26, 2010 (FR) .................................... 10 03122

(51) Int. Cl.
*H01L 29/82* (2006.01)

(52) U.S. Cl. .................. 257/421; 257/E29.323; 365/55; 365/158

(58) Field of Classification Search .................. 365/55, 365/158, 171–173; 257/421, E29.323; 438/3
See application file for complete search history.

(56) References Cited

U.S. PATENT DOCUMENTS

| | | | |
|---|---|---|---|
| 6,005,798 A * | 12/1999 | Sakakima et al. | 365/158 |
| 2008/0151615 A1 | 6/2008 | Rodmacq et al. | |
| 2009/0003042 A1 | 1/2009 | Lee et al. | |
| 2009/0237987 A1* | 9/2009 | Zhu et al. | 365/171 |

FOREIGN PATENT DOCUMENTS

| | | |
|---|---|---|
| EP | 1 942 527 A1 | 7/2008 |
| FR | 2 910 716 A1 | 6/2008 |
| WO | WO 2005/109517 A2 | 11/2005 |

OTHER PUBLICATIONS

French Preliminary Search Report for Application No. FR 1003122 dated Apr. 28, 2011.
Miron, I. M. et al., *Current-Driven Spin Torque Induced by the Rashba Effect in a Ferromagnetic Metal Layer*, Nature Materials, vol. 9, (2010), pp. 230-234.

* cited by examiner

*Primary Examiner* — Tucker Wright
(74) *Attorney, Agent, or Firm* — Alston & Bird LLP

(57) ABSTRACT

The invention relates to a writable magnetic element comprising a stack of layers presenting a write magnetic layer, wherein the stack has a central layer of at least one magnetic material presenting a direction of magnetization that is perpendicular to the plane of the central layer, said central layer being sandwiched between first and second outer layers of non-magnetic materials, the first outer layer comprising a first non-magnetic material and the second outer layer comprising a second non-magnetic material that is different from the first non-magnetic material, at least the second non-magnetic material being electrically conductive, and wherein it includes a device for causing current to flow through the second outer layer in a current flow direction parallel to the plane of the central layer, and a device for applying a magnetic field along a magnetic field direction that is perpendicular to the plane of the central layer.

21 Claims, 2 Drawing Sheets

WRITABLE MAGNETIC ELEMENT

FIELD OF THE INVENTION

The present invention provides a writable magnetic element of the current-induced reversal type.

BACKGROUND OF THE INVENTION

The magnetization of a layer or of a small magnetic element is commonly reversed by means of an applied magnetic field. The direction of the field is changed depending on whether it is desired to turn the magnetization in one direction or in another. Writing on magnetic tracks or on computer hard disks is based on this principle: the element for reversing is placed mechanically in the vicinity of a magnetic field generator so as to localize the field in three dimensions. It is the very structure of a magnetic field, which by definition is not localized in three dimensions, that raises numerous difficulties for integrating magnetic fields in devices. Thus, when no mechanical action is possible or desired, e.g. with solid magnetic memories known as magnetic random access memory (MRAM) or with logic devices, it is necessary to focus the magnetic field sufficiently for it to act only on the target cell and without impacting its neighbors. This problem becomes increasingly severe when the various memory or logic cells are located very close to one another in order to increase the density thereof.

The possibility of manipulating magnetization by means of a spin-polarized current, which was initially demonstrated theoretically in 1996, has provided a first solution to this problem. For the purpose of manipulating the magnetization at a memory point, this physical principle referred to as spin transfer torque (STT) requires the presence of at least two magnetic layers separated by a non-magnetic metal (for a spin valve type structure) or by an insulator (for a magnetic tunnel junction type structure), the two layers having magnetizations that are not colinear. The detailed physical explanation differs depending on whether a spin valve structure or a magnetic tunnel junction structure is involved, but in outline the current becomes spin polarized on passing through the first magnetic layer and then exerts torque on the magnetization of the second layer by means of the non-colinear component of the current polarization. When current densities are high enough, the magnetization of the second magnetic layer may be reversed both in spin valves and in magnetic tunnel junctions.

As described for example in U.S. Pat. No. 7,009,877 published on Mar. 7, 2006 and in US patent application No. 2009/129143 published on May 21, 2009, the write electric current necessarily passes through the junction perpendicularly to the plane of the layers.

This ability to manipulate locally the magnetization of a magnetic element of sub-micrometer size by means of an electric current immediately opens up possibilities for applications. At present, industrial actors are seeking to incorporate this principle in novel architectures for MRAM memory cells and logic components.

At present, such incorporation encounters various difficulties that appear to be inter-related.

Reversal by STT requires the presence at the memory point of at least two magnetic layers that are separated by a non-magnetic spacer. As described above, writing is performed by injecting a high-density current through the entire stack perpendicularly to the plane of the magnetic layers. Reading is performed by means of the magnetoresistance of the stack: giant magnetoresistance (GMR) for spin valves, and tunnel magnetoresistance (TMR) for magnetic tunnel junctions. At present, all or nearly all applications are based on using magnetic tunnel junctions. Thus although the GMR signal is only a few percent, the TMR signal from MgO-based junctions is commonly greater than 100%. Nevertheless, tunnel junctions have the disadvantage of presenting large values for the product of resistance multiplied by area (RA). Thus, for a typical current density of $10^7$ amps per square centimeter ($A/cm^2$) as needed for STT reversal, the voltage at the edges of the junction is 10 volts (V) for an RA of 100 ohm-square micrometers ($\Omega \cdot \mu m^2$), 1 V for an RA of 10 $\Omega \cdot \mu m^2$, and 0.1 V for an RA of 1 $\Omega \cdot \mu m^2$. Apart from the smallest value, the power dissipated in the junction is then large, which is harmful both in terms of energy consumption and in terms of damaging said junction. Furthermore, the high values of TMR that are useful in reading are often obtained by stacks that present high values for RA. That is why present research is seeking to obtain tunnel junctions that present high values of TMR and small values of RA. In addition, even for relatively small values of voltage at the edges of the junction, accelerated aging phenomena of the junction have been observed in operation that are due to voltage cycling. At present, numerous studies are devoted to this point both for optimizing materials in existing configurations and also for defining new configurations which make it possible to decouple the write and read problems as much as possible, by using configurations having three terminals, for example.

To summarize, a difficulty lies in the impossibility of independently optimizing reading and writing since, in known STT devices, those two phenomena are intrinsically linked.

A difficulty that results therefrom lies in the fact that writing requires current to be passed through the stack at very high density, as indicated above.

Yet another difficulty that is inherent to this link comes from the ever-greater complexity of the stacks. Thus, if it is desired that the STT effect is felt only in the layer that is to be reversed in order to store the magnetization, it is necessary for example to stabilize the other layers by means of exchange coupling with an antiferromagnetic material: if it is desired to increase the amplitude of the STT transfer, it is necessary to optimize the polarizing layers; if it is desired to reduce the magnetic fields radiated on the sensitive layers, it is necessary for example to use artificial antiferromagnetic bilayers; etc.

As a result, typical magnetic stacks of MRAM cells or logic components may have more than ten or 15 different layers of various materials. This then gives rise to difficulties during structuring steps, and in particular during the etching step, which is one of the major blocking points for integrating such magnetic stacks.

Another line of research is to manipulate the magnetization by means of a local electric field. This may be accomplished in part by modifying the anisotropy of a material by means of an outer electric field, with magnetization being reversed by means of an applied magnetic field. One such technique is described in the article by T. Maruyama et al. entitled "Large voltage-induced magnetic anisotropy charge in a few atomic layers of iron" (Nature Nanotechnology, Vol. 4, March 2009—Macmillan Publishers Ltd.).

At present, that technique makes it possible only to reduce the magnetic anisotropy of the material. The write and read processes are then the same as those described previously, and they have the same drawbacks.

SUMMARY OF THE INVENTION

An object of the present invention is to provide a magnetic writable element that, in order to invert magnetization, requires only the presence of a magnetic layer (having magnetization that is perpendicular to its plane) and that operates without the stack needing to pass a write current in a direction that is perpendicular to the layers.

The invention thus provides a writable magnetic element comprising a stack of layers presenting a write magnetic layer, wherein the stack has a central layer of at least one magnetic material presenting a direction of magnetization that is perpendicular to the plane of the central layer, said central layer being sandwiched between first and second outer layers of non-magnetic materials, the first outer layer comprising a first non-magnetic material and the second outer layer comprising a second non-magnetic material that is different from the first non-magnetic material at least the second non-magnetic material being electrically conductive, and wherein it includes a device for causing current to flow through the second outer layer and the central layer in a current flow direction parallel to the plane of the central layer, and a device for applying a magnetic field along a magnetic field direction that is perpendicular to the plane of the central layer.

The magnetization perpendicular to the panel of the central layer results from the anisotropy specific to the material of the central layer, or from anisotropy that is induced, e.g. by the interfaces for said material.

The electric current flows parallel to the magnetic layer and does not pass through the stack perpendicularly to the layers, and the memory may be written or erased, in the presence of said current and in particular in the presence of a current pulse, by acting on the direction of the applied magnetic field.

As explained below, the invention takes advantage of an effective magnetic field due to the Rashba field and of the s-d exchange interaction acting on local magnetization, said field being referred to below as the spin-orbit field. The spin-orbit field is orthogonal both to the current and to the electric field perpendicular to the plane of the interfaces due to the asymmetry of the stack, and thus in the shape of the invention to the anisotropy direction of the stack, and it makes it possible to reduce the energy barrier that separates two stable magnetization configurations. The applied magnetic field is oriented in the direction towards which the magnetization is to be oriented. Its amplitude is not sufficient for reversing the magnetization in the absence of current, but is sufficient to do so in the presence of current.

The central layer advantageously has thickness lying in the range 0.1 nanometers (nm) to 5 nm and preferably less than or equal to 2 nm.

The central layer advantageously comprises a magnetic compound presenting its own perpendicular magnetic anisotropy, i.e. in particular a FePt, FePd, CoPt, or CoPd alloy, or indeed a rare earth and transition metal alloy that likewise presents its own perpendicular magnetic anisotropy in the plane of the layers, such as GdCo, or TdFeCo.

The central layer advantageously comprises a metal or an alloy presenting perpendicular magnetic anisotropy induced by the interfaces, in particular Co, Fe, CoFe, Ni, CoNi.

At least one conductive outer layer is advantageously made of a non-magnetic metal, in particular of Pd, Cd, Cu, Au, Bi, Ir, Ru, W, or of an alloy of these metals. The thickness of such a conductive layer lies for example, in the range 0.5 nm to 100 nm, more particularly in the range 0.5 nm to 10 nm and is preferably less than or equal to 5 nm. The thickness of this layer may be selected independently from the thickness of the central layer.

When the first outer layer is non-electrically conductive, it is advantageously of a dielectric oxide such as $SiO_X$, $AlO_X$, $MgO_X$, $TiO_X$, $TaO_X$, or of a dielectric nitride such as $SiN_X$, $BN_X$. The thickness of this outer layer may for example lie in the range 0.5 nm to 200 nm, and more particularly in the range 0.5 nm to 100 nm, and is preferably less than or equal to 3 nm, in particular if the memory element is read by means of the tunnel magnetoresistance signal.

Both outer layers may be electrically conductive, but they are then selected from two different ones of said non-magnetic metals or metal alloys.

The current density lies for example in the range $10^4$ A/cm$^2$ to $10^9$ A/cm$^2$, and advantageously in the range $10^5$ A/cm$^2$ to $10^8$ A/cm$^2$.

The magnetic field may present a value lying in the range 20 oersted (Oe) (0.002 tesla (T)) to 10000 Oe (1 T), and advantageously lying in the range 50 Oe (0.005 T) to 800 Oe (0.8 T).

The first outer layer may be covered in a read layer of a magnetic material and a read electrode.

When the first outer layer is made of non-magnetic metal, it co-operates with the read layer, the read electrode, and the central magnetic layer to form a spin valve. The thickness of the first outer layer is less than 10 nm and preferably less than 5 mm.

When the first outer layer is dielectric, it co-operates with said read layer, the read electrode, and the central layer to form a magnetic tunnel junction. The thickness of the first outer layer is less than 5 nm, for example lying in the range 0.5 nm to 5 mm and preferably less than 3 nm.

The first outer layer and the central layer form a stud, while the second outer layer forms a track.

In a variant embodiment, the second outer layer includes a region of extra thickness that forms part of the stud.

The invention also provides a writable magnetic device including a plurality of said studs, in which the second outer layer is constituted by a said track that is common to the studs.

Alternatively, the magnetic writable device is wherein the first outer layer, the central layer, and the second outer layer form a stud, and wherein the writable magnetic device has a plurality of said studs together with an electrically conductive track bordering the second outer layers of said studs to inject said current through the second outer layer and the central layer of each of said studs, each second outer layer being made of an electrically conductive material that is different from that of the electrically conductive track.

BRIEF DESCRIPTION OF THE DRAWINGS

The invention can be better understood on reading the following description with reference to the drawings, in which.

DETAILED DESCRIPTION

Figure 1A:
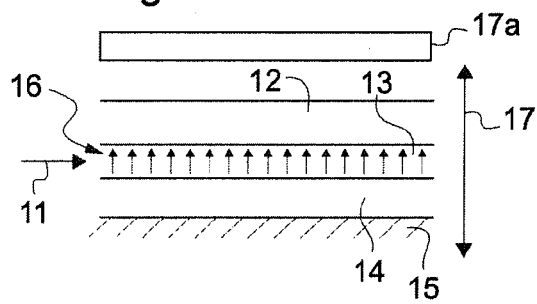
FIGS. 1a to 1f show an implementation of the invention,
FIGS. 2a and 2b showing an embodiment integrated in an MRAM type magnetic memory cell, and
FIGS. 3a to 3d showing embodiments in each of which a plurality of memory elements are shown to illustrate the architecture of the memory.

The stack implemented in the context of the present invention, i.e. a central magnetic layer sandwiched between two outer layers that are not magnetic, and at least one of which is conductive, the two outer layers being of different materials, has the effect of creating inversion asymmetry that generates a non-compensated electric field in the magnetic central layer. The electrons propagating in this electric field are subjected in their own frame of reference to a magnetic field known as the Rashba field $\vec{H_R}$. The Rashba field $\vec{H_R}$ is perpendicular both to the current flowing in the conductive layer and to the electric field. This magnetic field is thus applied to the conduction electrons.

The inventors have shown that an effective magnetic field (referred to as spin-orbit magnetic field) resulting from the Rashba field and the s-d exchange interaction coupling the spin of the itinerant and localized electrons is applied on the local magnetization.

Thus, the article by Joan Mihai Miron et al. entitled "Current-driven spin torque induced by the Rashba effect in a ferromagnetic metal layer", shows that a stack having a 3 nm thick layer of Pt, a 0.6 nm thick layer of Co having magnetization perpendicular to its plane and thus parallel to the z axis, and a 2 nm thick layer of $AlO_X$ conveying a current flowing parallel to the x axis. That stacking presents an effective magnetic field $H_{eff}$ (or spin-orbit field) along the third axis of the reference frame, the y axis. That configuration is thus inappropriate for making a memory since the magnetic field is not colinear with the magnetization of the layer.

The inventors have nevertheless shown that this spin-orbit magnetic field enables the applied magnetic field needed for reversing the magnetization of the magnetic layer to be reduced in unexpected manner. As they understand it, the energy barrier between the two stable perpendicular magnetization configurations is reduced by taking advantage of the spin-orbit magnetic field when a current is injected into a structure that presents inversion asymmetry. The applied magnetic field needed for reversal of the magnetization between these two stable configurations is then reduced compared with its value in the absence of injected current. The direction of the applied magnetic field is thus the direction in which it is desired to orient the magnetization.

FIGS. 1a to 1f show the implementation of the invention in which the direction of the applied magnetic field is perpendicular to the direction of the current and to the spin-orbit field direction and is parallel to the direction of magnetization that is perpendicular to the plane of the magnetic central layer.

Reference 15 designates a substrate that is an electrical insulator so as to avoid short-circuiting the structure. It may in particular be constituted by a dielectric oxide (e.g. $SiO_X$, $AlO_X$, $MgO_X$) or by a nitride, e.g. $SiN_X$. It may be on its own or it may be deposited on some other substrate, e.g. of silicon.

Reference 13 designates the plane magnetic layer of magnetization that is perpendicular to its plane. Reference 16 designates the orientation of the magnetization, which may be present in one direction or in the opposite direction.

References 12 and 14 designate respectively the first and second non-magnetic outer layers. The second outer layer 14 is the layer through which the write current flows.

Reference 11 designates the current direction which is parallel to the plane of layer 13, and reference 17 designates the orientation of the applied magnetic field, which is parallel to the magnetization direction, and therefore perpendicular to the plane of the central layer 13 and which may be present in the same direction or in the opposite direction. Reference 17a designates the device for applying the magnetic field along a magnetic field direction that is perpendicular to the plane of the central layer.

Figure 1B:
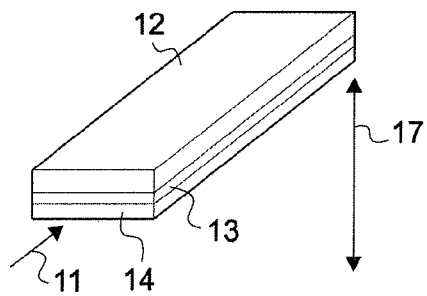
Figure 1C:
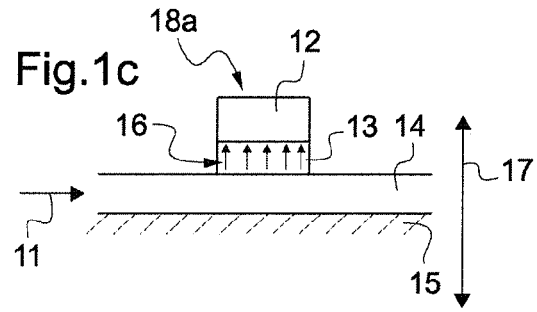
Figure 1D:
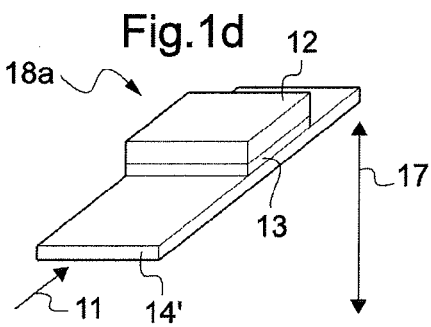

FIGS. 1a and 1b show a non-structured stack in which the layers 12, 13, and 14 of the stack form a track.

Figure 1E:
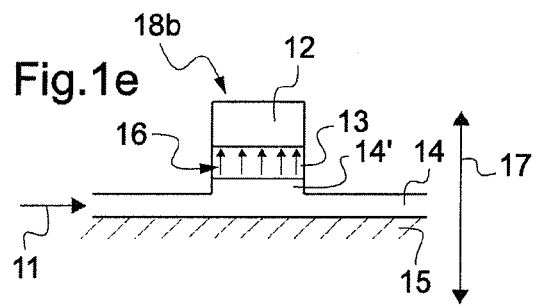
Figure 1F:
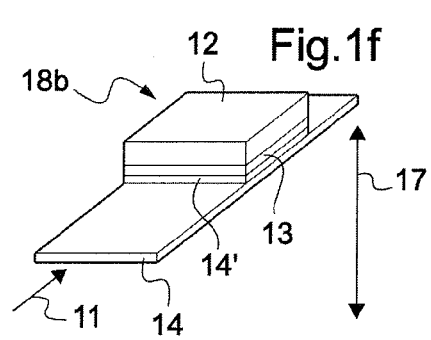

FIGS. 1c to 1f show a structured stack in which the layer 14 is conductive and the magnetic layer 13 and the non-magnetic layer 12 are the only layers to be structured so as to form studs 18a (FIGS. 1c and 1d), or else in which the three layers 12, 13, and 14 are structured to constitute a stud 18b by integrating an extra thickness 14' of the conductive layer 14 such that the stud contains a fraction of the thickness of the non-magnetic material of the layer 14 (FIGS. 1e and 1f). The thickness to be taken into account for the second outer layer is the thickness of the layer 14 proper, plus the extra thickness 14'.

It should be observed that the region of extra thickness 14' is not necessarily made of the same electrically conductive material as the layer 14, in which case it is only the extra thickness 14' that acts as the second non-magnetic outer layer and it is its material that is functional in the stack in order to obtain inversion asymmetry. The metallic material of the layer 14 may then be any material.

Forming studs 18a or 18b makes it possible to reverse magnetization in the studs only, since otherwise magnetization would be reversed over the entire length of the track.

The magnetic layer 13 presents perpendicular magnetization and its thickness is rather fine so that the electric field due to the interfaces is not negligible. Typically its thickness does not exceed 2 nm and it is at most 5 nm. All of the magnetic materials presenting perpendicular magnetization, e.g. due to their own perpendicular magnetic anisotropy (FePt, FePd, CoPt, . . . alloys; alloys of rare earths and transition metals such as GdCo, TbFeCo, . . . ) or presenting a perpendicular magnetic anisotropy that is induced by the interfaces (Co, Fe, CoFe, Ni, CoNi, . . . ) may be used. It is also possible to take non-metallic magnetic materials such as magnetic semiconductors, for example, e.g. GaMnAs (i.e. Mn-doped GaAs). It should be observed that known magnetic semiconductor materials are magnetic only at temperatures lower than ambient.

When the perpendicular anisotropy of the magnetic material is induced by the interfaces, it is possible to obtain magnetization perpendicular to the plane by acting on the thickness of the central layer and/or on the oxidation state of an outer oxide layer, e.g. by modifying the deposition parameters of said oxide outer layer or by performing annealing after making the stack.

EXAMPLE

A stack comprising a 2 nm thick Pt conductive layer 14, a 1 nm thick Co central layer 13, and an $AlO_X$ layer 12 presents for a given oxidation state of said $AlO_X$ layer magnetization that is perpendicular, whereas if the thickness of the Co layer is equal to 1.5 nm, the magnetization is in the plane. If the stack is subjected to annealing at 300° C. for 60 minutes in a vacuum, then the magnetization of the Co central layer 13 is perpendicular to the plane. At a thickness greater than 3 nm for the Co layer, it is not possible to obtain magnetization outside the plane regardless of the annealing or the oxidation parameters if the layer 12 is made of $AlO_X$. However, if the dielectric used for the layer 12 is $MgO_X$, it is possible to obtain perpendicular magnetization for a thickness of the central layer that is greater than 3 nm.

The influence of the thickness of a cobalt layer on magnetic properties for different oxides ($AlO_X$, $MgO_X$, $SiO_X$) is described in the article "Domain patterns and magnetization reversal behaviors in oxide/Co/Pt films" by Jae Chul Lee et al., published in IEEE Transactions on Magnetics, Vol. 46, No. 6, June 2010.

The effect of oxidation and annealing on magnetic properties in Pt/Co/$AlO_X$ trilayers is described in the article "Influence of thermal annealing on the perpendicular magnetic anisotropy of Pt/Co/$AlO_X$ trilayers" by B. Rodmacq et al., published in Physical Review B 79 024423 (2009).

The influence of the oxidation state of an oxide layer on the magnetic properties of the cobalt layer in a platinum/cobalt/metal oxide trilayer stack is described in the article "Analysis of oxygen induced anisotropy crossover in Pt/Co/MO$_X$ trilayers" by A. Manchon et al., published in Journal of Applied Physics 104, 043914 (2008).

The two non-magnetic layers 12 and 14 need to be different in order to create inversion asymmetry in the overall structure. Advantageously, two different materials are selected for each of these layers, e.g. a dielectric for one of the two and a metal for the other, however it is also possible to select a metal for each of them. Having both layers 12 and 14 dielectric is possible only if the structure forms a track and not a stud. It is then possible to cause current to flow directly in the central layer 13 that consists of a track.

Thus, each of the two non-magnetic layers 12 and 14 may be constituted by the following materials, on condition that the layers are different and that the overall stack (layers 12, 13, and 14) has perpendicular magnetization: a dielectric oxide (SiO$_X$, AlO$_X$, MgO$_X$, TiO$_X$, TaO$_X$, HfO$_X$, . . . ); a dielectric nitride (SiN$_X$, Bn$_X$, . . . ); a non-magnetic metal (Pt, Pd, Cu, Au, Bi, Ta, Ru, . . . ); a non-magnetic alloy of these metals; and an optionally organic semiconductor compound (e.g. GaAs, Si, Ge or graphene associated, where necessary, with a growth buffer, e.g. a metal such as iridium).

When one or the other of the non-magnetic layers is conductive, the two outer layers must not have the same composition.

Figure 2A:
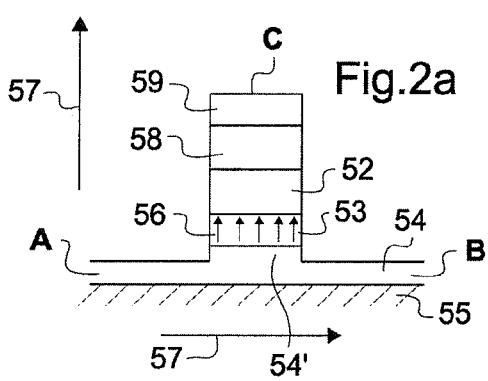
Figure 2B:
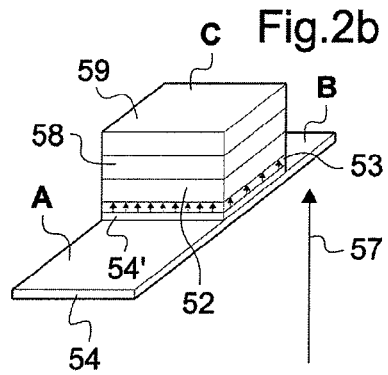

The thicknesses of the layers 12 and 14 may be selected over a wide range of values, typically thicknesses of 0.5 nm to 200 nm, and more particularly lying in the range 0.5 nm to 100 nm. When the layer 12 is an insulating layer, there is no harm in its value reaching a significant value, typically 100 nm, except when the memory point is read by means of a tunnel magnetoresistance signal, e.g. by adding a magnetic layer and an electrode above said insulating layer, as shown in FIGS. 2a and 2b. Under such circumstances, the thickness of the insulating layer is preferably selected to be less than 3 nm. With the layers 12 and/or 14 made of metal, it is preferred to have layers that are fine, typically less than 5 nm thick and generally less than 10 nm thick, so as to avoid on the one hand, excessively reducing the effective current passing through the magnetic layer as a result of these conductive channels in parallel and so as to enable on the other hand, the memory point to be read by means of a giant magnetoresistance signal.

These various layers may be deposited by any known technique such as: evaporation, sputtering, electrochemical deposition, chemical growth, . . . .

The layer 14 may be omitted in certain shapes. The magnetic layer 13 should then be deposited directly on the insulating substrate 15 (that acts as a non-magnetic layer) and the non-magnetic layer 12 should be selected so as to have inversion asymmetry, i.e. out of a material that is different from the material constituting the substrate 15. Nevertheless, it should be observed that when studs are structured, the layer 14 must be present and constituted by an electrically conductive material so as to be able to inject current into the structured studs (here 18a and 18b). Under such circumstances, the extra thickness portion 14' must also be conductive so that, in combination with the layer 12, the looked-for inversion asymmetry is generated in order to generate a Rashba field and enable current to be injected into the magnetic central layer 13.

The element to be reversed, whether the track shown (FIG. 1a or 1b) or a stud fitted on or structured in the track (FIG. 1c to 1f), is connected by conductive electrodes known per se, as to inject a current along direction 11.

The field applied colinearly to the magnetization direction and in the direction in which it is desired to orient the magnetization has an amplitude that is not sufficient to reverse the magnetization in the absence of a current pulse, but that is sufficient in the presence of a current pulse. It may thus be presented in the form of a pulse, either accurately synchronized with a current pulse, or of shorter duration than the current pulse and contained within it, or indeed its duration may be longer than that of the current pulse, with this solution possibly being simpler to integrate in applications.

Thus, under such circumstances, the current injection direction may be selected arbitrarily, both directions having a similar effect on lowering the anisotropy barrier.

It is also possible to use a constant current and to generate a magnetic field in the desired direction, but this solution is less advantageous from the point of view of electricity consumption since magnetization is stable in the absence of current and there is no need to apply a current in the conductive layer except during a writing step, so if a constant current is used then the energy barrier between the two magnetization states (upwards and downwards) is reduced all the time, which runs the risk of giving rise to undesired changeovers of magnetization.

The magnetic field values to be applied are associated with the anisotropy of the material, with its coercive magnetic field, and with the injected current density. Typically this field may lie in the range 20 Oe (0.002 T) to 10 kOe (1 T) and more particularly in the range 0.005 T to 0.8 T, while the current densities may lie in the range $10^2$ A/cm$^2$ to $10^9$ A/cm$^2$, and more particularly in the range $10^5$ A/cm$^2$ to $10^8$ A/cm$^2$.

The higher the current density applied during a write step, the lower the value of the magnetic field that needs to be applied to inverse the magnetization.

The magnetic field may also be applied in various ways, e.g. simply using a current flowing in a coil so as to generate an overall magnetic field over the entire device, in which case only those studs (memory points) that have their energy barrier reduced by current injection will be reversed, or by means of tracks conveying a current of the kind used in prior art MRAM memories with reversal being induced by a magnetic field.

FIGS. 2a and 2b show an example of a stack usable in an MRAM memory cell.

Reference 53 designates the magnetic central layer sandwiched between two different non-magnetic materials 52 and 54 with an optional extra thickness 54' for making the stack as described above, on a substrate 55 that is electrically insulating.

Reference 57 designates the axis of the applied external magnetic field. This field may be applied in one or other direction as a function of the looked-for direction for the desired writing.

For reading purposes there are placed above the stack a layer 58 of a magnetic material and a top electrode 59 that may contain one or more conductive layers (that may be magnetic or non-magnetic).

The function of the layer 58 is to enable the structure 53, 52, and 58 to present different electrical resistance values depending on the direction of the magnetization 56 of the layer 53 (magnetoresistance signal). It is involved only for reading and has no effect on manipulating the magnetization of the layer 53.

In other words, writing and reading are defined independently and may be optimized separately.

The electrode 59 may comprise one layer or it may in conventional manner comprise a stack of different functional layers. For example it may contain:

a stack defining synthetic antiferromagnetism so as to limit the fields radiated onto the layer 53 that is to be manipulated, e.g. a stack comprising a ferromagnetic layer separated from the ferromagnetic layer 58 by a very fine layer of a non-magnetic metallic material, typically 0.3 nm of ruthenium (Ru), the values of the magnetizations of the two ferromagnetic layers being as close to each other as possible so that the antiferromagnetic coupling between them that is due to the presence of the ruthenium layer results in the total field as radiated by these three layers on the layer 53 being zero or practically zero;

or else an antiferromagnetic magnetic material coupled by exchange with the layer 58 so as to stabilize this so-called "reference" layer 58;

or else non-magnetic conductive materials for making electrical contacts;

or indeed a combination of those various possibilities, e.g. an antiferromagnetic material adjacent to a ferromagnetic material so as to stabilize the magnetization thereof by coupling between these two materials, the ferromagnetic material being separated from the layer 50 by a fine metallic layer, typically 0.3 nm of Ru, so that the magnetic coupling between these two ferromagnetic layers is antiferromagnetic. Finally, the first magnetic material is covered in one or more non-magnetic conductive layers, e.g. 5 nm of Ta covered in 7 nm of Ru. Examples of such combinations can be found in the magnetic stacks used for STT reversal as described for example by B. Dieny et al., Int. J. Nanotechnology, Vol. 7, 591 (2010).

Two main configurations may be distinguished depending on the nature of the layer 52: if it is made of non-magnetic metal, then the structure 53, 52, and 58 is of the spin-valve type, whereas if the layer 52 is dielectric, then the structure 53, 52, and 58 is of the magnetic tunnel junction type. When the layer 52 is made of non-magnetic material, its thickness is less than 10 nm and preferably less than 5 nm, whereas when the layer 52 is dielectric, its thickness is less than 5 nm and preferably less than 3 nm. Since the magnetoresistance signal is much stronger for magnetic tunnel junction type structures, they are the preferred structures. Similarly, in order to optimize the magnetoresistance signal, in either circumstance, the preferred configuration is that in which the magnetization of the layer 58 is colinear, either parallel or anti-parallel with the magnetization of the layer 53.

In FIGS. 2a and 2b, A, B, C designate three electrical connection terminals. During the write stage, a current is injected between the terminals A and B (or in equivalent manner a voltage is applied between said terminals so as to cause a current to flow). The current passes through the magnetic layer 53 and produces an effective magnetic field in said layer due to the Rashba field and the s-d interaction acting on the local magnetization (see above-mentioned article by I. M. Miron et al.). The effective field (or spin-orbit field) in combination with the applied external field makes it possible, according to the invention, to manipulate the magnetization by taking advantage of the reduction in the energy barrier separating the two stable magnetization configurations. The magnetization is reversed if a magnetic field is applied in the direction opposite to the direction of the magnetization. When the layer 52 is constituted by a dielectric material, the laterally-injected current does not pass through said layer and does not damage it.

The stored information, typically the orientation of the magnetization in the layer 53 is read both for a tunnel junction type structure and for a spin valve type structure by injecting a low value current (e.g. of the order of a few microamps ($\mu A$) to a few tens of $\mu A$ for a tunnel junction) between the terminals C and B (or in equivalent manner between the terminals C and A), and by measuring the voltage between these terminals; or else by applying a constant voltage between the terminals C and B (or in equivalent manner between the terminals C and A), and measuring the current that flows between these terminals so as to measure in all cases the resistance between the terminals in question.

The resistance has two different values depending on whether the direction of magnetization 56 is parallel or anti-parallel to that of the reference layer 58. The read current has a low value so that the tunnel barrier (when the layer 52 is dielectric) is not damaged.

Figure 3A:
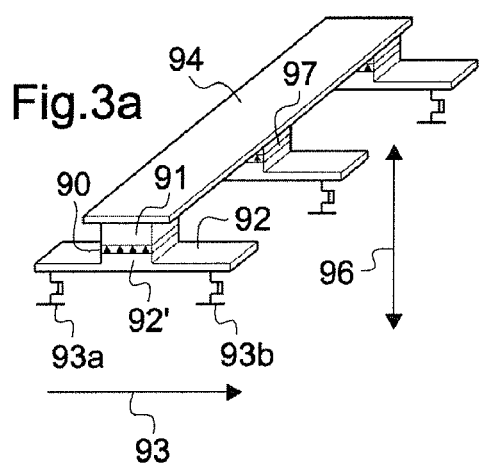
Figure 3B:
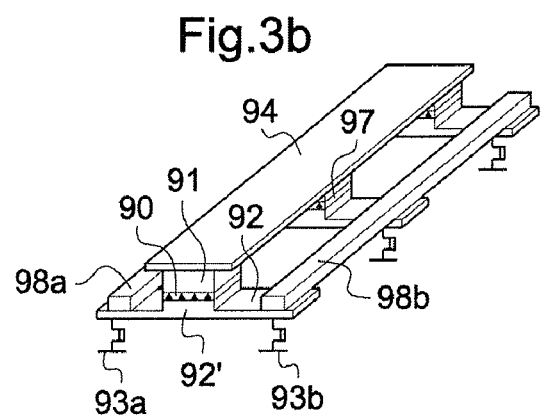
Figure 3C:
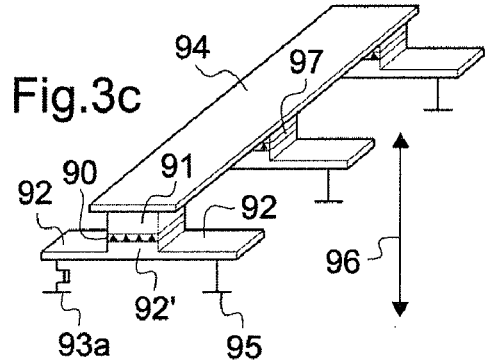
Figure 3D:
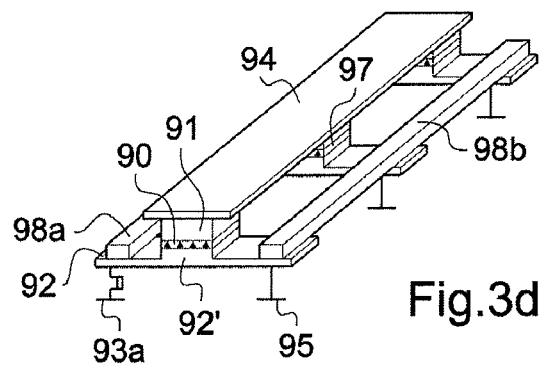

Examples of memory architectures are described below with reference to FIGS. 3a to 3d, in which FIGS. 3b and 3d relate to generating the applied magnetic field by field lines conveying a current, implementing the structure of FIGS. 2a and 2b.

FIGS. 3a to 3d show possible architectures for a memory using the described case. There can be seen the magnetic layer 90 with perpendicular magnetization 97 sandwiched between two non-magnetic layers 91 and 92 (corresponding to the layers 12 and 14 in FIGS. 1a to 1f and 52 and 54 in FIGS. 2a and 2b).

Here, in order to simplify, the layer 91 comprises both the layer 12 or 52 and magnetic and non-magnetic layers serving to define a tunnel junction or spin-valve type stack, thus making it possible to read the magnetization state of the layer 90 (like the layers 52, 58, and 59 in FIGS. 2a and 2b).

The magnetization of the layer 90 is reversed by means of a current flowing in the bottom electrode 92 and a variable magnetic field oriented along arrow 96 along the magnetization axis and in the direction for switching the magnetization within the layer 90.

To do this, the second non-magnetic layer constituting the sandwich 92 is structured in this example in the form of a current feed track. This track may also be constituted, for example, by another layer of another material situated under the layer 92. Current injection is controlled by transistors.

Two cases are used as examples. In a first case, two transistors 93a and 93b are used as switches with the free terminals thereof being connected one to ground and the other to a voltage $V_{dd}$, and the voltage $V_{dd}$ being selected to cause a current of the selected value to flow.

In a second case, only one transistor 93a is used and the other end of the track 92 is connected to a constant voltage.

It can be observed at this point that the current flow direction does not influence the operation of the mechanism and that regardless of the current flow direction the barrier will be decreased in the same manner.

Two methods of operation are thus possible:

Symmetrical Operation:

The track connected for example to the transistor 93a is connected to the voltage $V_{dd}$, or to ground while the other track connected at the end of the track 92 at 95 is connected to ground (or to $V_{dd}$). This configuration enables a greater current to be generated than the following configuration.

Asymmetrical Operation (Preferred):

The track connected to the end of the track 92 by 98 is connected to an intermediate potential, e.g. $V_{dd}/2$, while the track connected to the transistor 93a is taken to the potential $V_{dd}$ or to ground depending on the desired current direction. This configuration enables less current to be generated than the previously described configuration. The invention makes it possible to inject a current in the writing mode on an area that is much smaller than the areas used in known techniques, and said current suffices to make the device operate. In this embodiment, operation consumes less electricity.

In the case described here, it is the applied magnetic field that switches the magnetization. The magnetic field 96 must therefore be variable and oriented parallel to the magnetization direction. One possible embodiment is shown in FIGS. 3b and 3d. The magnetic field is generated by two field lines 98a and 98b placed on either side of the stack. When these lines pass a current, a magnetic field is generated perpendicularly to the layers in the magnetic layer 90. In certain arrangements it is possible to omit one of these field lines, e.g. the line 98b, and make use of only one. These lines may for example be implemented in the form of conductive films during the step of nanofabricating the structures.

What is claimed is:

1. A writable magnetic element comprising a stack of layers presenting a write magnetic layer, wherein the stack has a central layer of at least one magnetic material presenting a direction of magnetization that is perpendicular to the plane of the central layer, said central layer being sandwiched between, and in direct contact with, first and second outer layers of non-magnetic materials, the first outer layer comprising a first non-magnetic material and the second outer layer comprising a second non-magnetic material that is different from the first non-magnetic material, at least the second non-magnetic material being electrically conductive, and wherein it includes a device for causing current to flow through the second outer layer in a current flow direction parallel to the plane of the central layer, and a device for applying a magnetic field along a magnetic field direction that is perpendicular to the plane of the central layer.

2. A magnetic element according to claim 1, wherein the central layer has a thickness lying in the range 0.1 nm to 5 nm.

3. A magnetic element according to claim 1, wherein the central layer comprises a magnetic compound presenting its own perpendicular magnetic anisotropy selected from the group consisting of FePt, FePd, CoPt, CoPd, GdCo, and TdFeCo.

4. A magnetic element according to claim 1, wherein the central layer comprises a metal or a metal alloy presenting perpendicular magnetic anisotropy induced by the interfaces, in particular Co, Fe, CoFe, Ni, CoNi.

5. A magnetic element according to claim 1, wherein at least one outer conductive layer is made of a non-magnetic metal comprised of Pt, Pd, Cu, Au, Bi, Ir, Ru, W or out of an alloy of these metals.

6. A memory element according to claim 5, wherein the thickness of the said outer conductive layer lies in the range selected from the group consisting of 0.5 nm to 100 nm, 0.5 nm to 10 nm, and less than or equal to 5 nm.

7. A magnetic element according to claim 1, wherein the first outer layer is made of $SiO_x$, $AlO_x$, $MgO_x$, $TiO_x$, $TaO_x$, or $HfO_x$, or out of a dielectric nitride selected from the group consisting of $SiN_x$, and $BN_x$.

8. A magnetic element according to claim 7, wherein the thickness of a said first outer layer of dielectric oxide lies in the range selected from the group consisting of 0.5 nm to 200 nm, 0.5 nm to 100 nm, and less than 3 nm.

9. A magnetic element according to claim 1, wherein the two outer layers are conductive and are both made of different ones of said non-magnetic materials or alloys.

10. A magnetic element according to claim 1, wherein the current presents a current density lying in the range $10^4$ $A/cm^2$ to $10^9$ $A/cm^2$ or lying in the range $10^5$ $A/cm^2$ to $10^8$ $A/cm^2$.

11. A magnetic element according to claim 1, wherein the applied magnetic field presents a value lying in the range selected from the group consisting of 0.002 T to 1 T and in the range 0.005 T to 0.8 T.

12. A magnetic element according to claim 1, wherein the first outer layer is covered in a read layer of magnetic material and by a read electrode.

13. A magnetic element according to claim 12, wherein the first outer layer is made of non-magnetic metal and in that it co-operates with the layer, the read layer, and the read electrode to form a spin valve.

14. A magnetic element according to claim 12, wherein the first outer layer is dielectric and it co-operates with the central layer, the read layer and the read electrode to form a magnetic tunnel junction.

15. A magnetic element according to claim 12, wherein the thickness of the first outer layer is selected from the group consisting of less than 5 nm and less than 3 nm.

16. A magnetic element according to claim 1, wherein the first outer layer and the central layer form a stud and in that the second outer layer forms a track.

17. A magnetic element according to claim 16, wherein the second outer layer includes a region of extra thickness that forms part of the stud.

18. A writable magnetic device, including a plurality of studs according to claim 16, with the second outer layer thereof including a said track that is common to the studs.

19. A writable magnetic device, wherein the first outer layer, the central layer, and the region of extra thickness of the second outer layer form a stud according to claim 17, and wherein the device includes a plurality of said studs, together with an electrically conductive track beside the second outer layer of said stud to inject said current through the second outer layer and the central layer of each of said studs, the second outer layer being made of an electrically conductive material different from the material of the electrically conductive track.

20. A magnetic element according to claim 1, wherein the central layer comprises a magnetic compound presenting its own perpendicular magnetic anisotropy.

21. A magnetic element according to claim 1, wherein the second outer conductive layer is made of a non-magnetic metal selected from the group consisting of Pt, Pd, Cu, Au, Bi, Ir, Ru, and W and alloys thereof.

* * * * *

UNITED STATES PATENT AND TRADEMARK OFFICE
CERTIFICATE OF CORRECTION

PATENT NO. : 8,350,347 B2  
APPLICATION NO. : 12/899072  
DATED : January 8, 2013  
INVENTOR(S) : Gaudin et al.

Page 1 of 1

It is certified that error appears in the above-identified patent and that said Letters Patent is hereby corrected as shown below:

Column 5,
Line 9, "Joan Mihai Miron et al." should read --Ioan Mihai Miron et al.--.

Signed and Sealed this
Nineteenth Day of March, 2013

Teresa Stanek Rea
*Acting Director of the United States Patent and Trademark Office*